United States Patent
Naito et al.

[11] Patent Number: 6,060,390
[45] Date of Patent: May 9, 2000

[54] METHOD OF FORMING WIRING LAYER

[75] Inventors: Masaru Naito; Takahisa Yamaha, both of Hamamatsu, Japan

[73] Assignee: Yamaha Corporation, Japan

[21] Appl. No.: 08/852,097

[22] Filed: May 6, 1997

[30] Foreign Application Priority Data

May 8, 1996 [JP] Japan ................................ 8-113993

[51] Int. Cl.[7] .................................................. H01L 21/44
[52] U.S. Cl. ........................ 438/656; 438/660; 438/688
[58] Field of Search .................... 438/688, 656, 438/660

[56] References Cited

U.S. PATENT DOCUMENTS

| | | |
|---|---|---|
| 4,751,198 | 6/1988 | Anderson . |
| 4,926,237 | 5/1990 | Sun et al. .................................. 357/71 |
| 5,286,675 | 2/1994 | Chen et al. .............................. 437/195 |
| 5,407,861 | 4/1995 | Marangon et al. . |
| 5,443,995 | 8/1995 | Nulman . |
| 5,472,912 | 12/1995 | Miller ..................................... 437/194 |
| 5,529,955 | 6/1996 | Hibino et al. ........................... 437/195 |
| 5,705,429 | 1/1998 | Yamaha et al. . |
| 5,716,869 | 2/1998 | Hibino et al. . |

FOREIGN PATENT DOCUMENTS

| | | |
|---|---|---|
| 4-130720 | 5/1992 | Japan . |
| 5-326722 | 12/1993 | Japan . |
| 7-115074 | 5/1995 | Japan . |

OTHER PUBLICATIONS

Sze, S.M., Semiconductor Devices Physics and Technology, John Wiley & Sons, pp. 4, 6–7, 1985.

*Primary Examiner*—John F. Niebling
*Assistant Examiner*—J. Jones
*Attorney, Agent, or Firm*—Ostrolenk, Faber, Gerb & Soffen, LLP

[57] ABSTRACT

An interlayer insulating film made of insulating material is deposited on a substrate having a conductive region at least partially on the surface area thereof. A connection hole is formed through the interlayer insulating film, to expose the conductive region. The connection hole is filled with a plug made of conductive material. An underlying layer made of Ti is deposited over the whole surface of the substrate including the surface of the plug. A wiring layer made of Al alloy is deposited on the underlying layer, without exposing the substrate to the external atmosphere after the deposition of the Ti layer. The wiring layer is reflowed by heating the substrate. A method is provided which is capable of connecting an upper wiring layer to a lower conductive region without lowering resistance to electromigration and lowering step coverage.

26 Claims, 7 Drawing Sheets

METHOD OF FORMING WIRING LAYER

This application is based upon Japanese Patent Application HEI-8-113993 filed on May 8, 1996, the entire contents of which are incorporated herein by reference.

BACKGROUND OF THE INVENTION a) Field of the Invention

The present invention relates to a method of forming a wiring layer, and more particularly to a method of forming a wiring layer in which an upper wiring layer is connected to a lower conductive region or lower wiring layer via a connection hole formed in an interlayer insulating film.

An Al layer or Al alloy layer is used as the main wiring layer of a laminated structure of a semiconductor device. Hereinbelow, the term "Al alloy" is used to include also Al unless otherwise specified.

b) Description of the Related Art

Figure 6A:
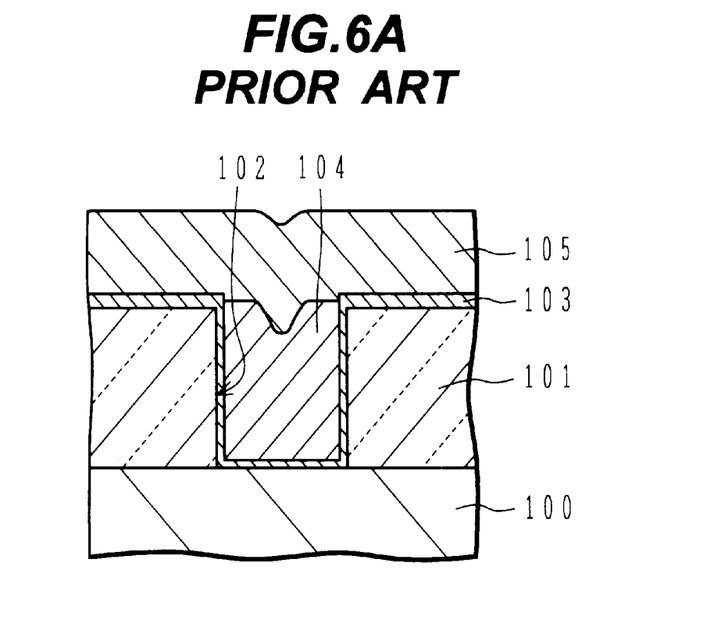
FIGS. 6A and 6B are cross sectional views of connection holes in substrates illustrating conventional methods of forming a wiring layer.

With reference to FIG. 6A, a method of forming a wiring layer disclosed in Japanese Patent Laid-open Publication HEI-7-115074 will be described. A substrate 100 with a conductive surface has an interlayer insulating film 101 with a connection hole 102 formed therein. The inner surface of the connection hole 102 and the surface of the interlayer insulating film 101 are covered with an adhesion layer 103 made of Ti or the like. The connection hole 102 covered with the adhesion layer 103 has a plug 104 made of W or the like filled therein. For example, the plug 104 is formed by depositing a W film over the whole surface of the substrate, to fill the inside of the connection hole 102, and by etching back the exposed W film to leave it only in the inside of the connection hole 102. The upper surfaces of the plug 104 and adhesion layer 103 are deposited with a wiring layer 105 made of Al alloy. After the wiring layer 105 is deposited, the substrate is heated to reflow the wiring layer 105 to improve step coverage.

Figure 6B:
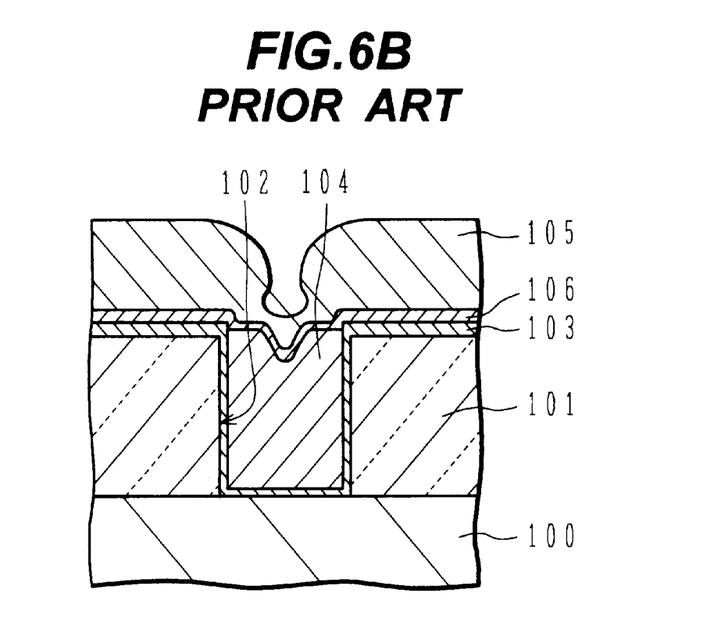

With reference to FIG. 6B, a wiring layer forming method disclosed in Japanese Patent Laid-open Publication HEI-5-326722 will be described. The structures of a substrate 100, an interlayer insulating film 101, a connection hole 102, an adhesion layer 103, and a plug 104 are the same as those shown in FIG. 6A. The upper surfaces of the plug 104 and adhesion layer 103 are covered with an underlying layer 106 made of Ti. On the underlying layer 106, a wiring layer 105 made of Al alloy is formed.

As shown in FIGS. 6A and 6B, the conductive surface of the substrate 100 and the wiring layer 105 are electrically connected by the plug 104 embedded in the connection hole 102.

With the wiring layer forming method illustrated in FIG. 6A, the adhesion layer 103 is generally formed by sputtering, and the W film for forming the plug 104 is formed by CVD or the like in order to reliably bury it in the connection hole 102. Therefore, the adhesion layer 103 is exposed to the ambient atmosphere after the adhesion layer 103 is deposited and before the W film is deposited, so that the surface of the adhesion layer 103 may be oxidized. When this W film is etched back, the exposed surface of the adhesion layer 103 becomes rough.

Because of an oxide film formed on the surface of the adhesion layer 103 and because of a rough surface of this layer, (1 1 1) orientation of Al alloy of the wiring layer 105 formed on the adhesion layer 103 is degraded which lowers resistance to electromigration.

With the wiring layer forming method illustrated in FIG. 6B, the underlying layer 106 made of Ti is formed under the wiring layer 105. Since the wiring layer 105 can be deposited without exposing the underlying layer 106 to an ambient atmosphere after the underlying layer 106 is formed, it is possible to suppress degradation of the (1 1 1) orientation of Al alloy. However, if there is any dent on the surface of the plug 104, the step coverage of the wiring layer 105 is lowered.

SUMMARY OF THE INVENTION

It is an object of the present invention to provide a wiring layer forming method capable of interconnecting an upper wiring layer and a lower wiring layer without lowering resistance to electromigration and step coverage.

According to one aspect of the present invention, there is provided a method of forming a wiring comprising the steps of: a) depositing an interlayer insulating film made of insulating material on a substrate having a conductive region at least partially on a surface area of the substrate; b) forming a connection hole through the interlayer insulating film, the connection hole partially exposing the conductive region; c) filling the connection hole with a plug made of conductive material; d) depositing an underlying layer made of Ti over whole surface of the substrate including a surface of the plug; e) depositing a wiring layer made of Al alloy on the underlying layer; and f) reflowing the wiring layer by heating the substrate.

By forming the underlying layer of Ti under the wiring layer of Al alloy, (1 1 1) orientation of Al alloy can be improved. Improved (1 1 1) orientation of Al alloy provides good resistance to electromigration.

By reflowing the wiring layer after it is formed, the wiring layer can be planarized and resistant to electromigration can be improved further. This may be ascribed to the thermally stabilized wiring layer by heat hysteresis during the reflow process.

The step of depositing the wiring layer is preferably executed after the step of depositing the underlying layer without exposing the surface of the underlying layer in an oxidizing atmosphere.

By depositing the wiring layer without exposing the surface of the underlying layer in the oxidizing atmosphere, (1 1 1) orientation of Al alloy can be improved further.

The reflow step is preferably executed by heating the substrate after the step of depositing the wiring layer without exposing the surface of the wiring layer in an oxidizing atmosphere.

The reflow process without exposing the surface of the wring layer in the oxidizing atmosphere can suppress the generation of a hillock during the reflow process.

As above, the underlying layer under the Al alloy wiring layer can improve (1 1 1) orientation of Al alloy and improved resistance to electromigration can be expected. The reflow process after the wiring layer is deposited can improve the thermal stability of the wiring layer and improved resistance to electromigration can be expected. The successive reflow process to be executed after the wiring layer is deposited, without exposing it in the oxidizing atmosphere, can suppress the generation of a hillock on the surface of the wiring layer.

DETAILED DESCRIPTION OF THE PREFERRED EMBODIMENTS

With reference to FIGS. 1A to 1E, a method of forming a wiring layer according to an embodiment of the invention will be described by taking as an example interconnection between an upper wiring layer and source/drain regions of a metal-oxide-semiconductor field effect transistor (MOSFET).

Figure 1A:
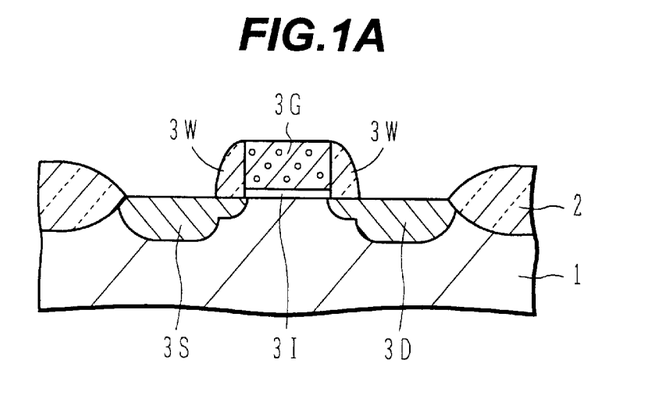
FIGS. 1A to 1E are cross sectional views of a substrate illustrating a method of forming a wiring layer according to an embodiment of the invention.

As shown in FIG. 1A, a field oxide film 2 is formed on the surface of a silicon substrate 1 and defines an active region of the substrate 1. In this active region, a MOSFET is formed which has a source region 3S, a drain region 3D, a gate insulating film 3I, and a gate electrode 3G. On both side walls of the gate electrode 3G, side wall insulators 3W are formed. The side wall insulators 3W are used as an ion implantation mask for forming high impurity concentration regions of a lightly doped drain structure (LDD), and also electrically separate the gate electrode from the source/drain regions.

Figure 1B:
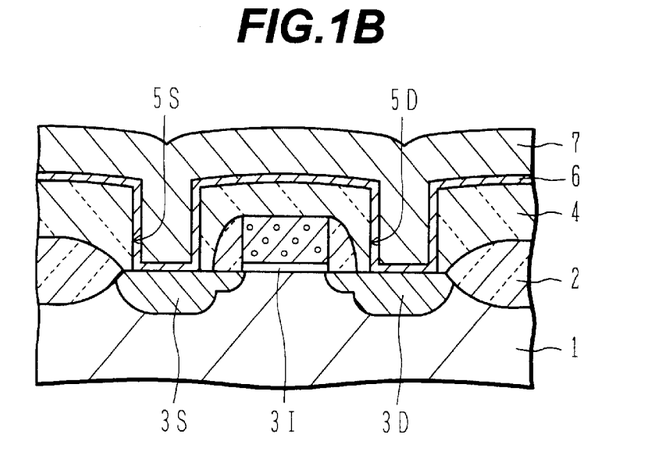

As shown in FIG. 1B, an interlayer insulating film 4 is formed over the whole surface of the substrate to cover MOSFET, through chemical vapor deposition (CVD). The interlayer insulating film 4 has, for example, a lamination structure of phosphosilicate glass (PSG) and borophosphosilicate glass (BPSG). Connection holes 5S and 5D are formed through the interlayer insulating film 4 to partially expose the surfaces of the source region 3S and drain region 3D at the bottoms of the connection holes 5S and 5D.

An adhesion layer 6 is deposited by sputtering on the inner surfaces of the connection holes 5S and 5D and the surface of the interlayer insulating film 4. The adhesion layer 6 has a two-layer structure including a Ti film of 20 nm thick and a TiN film of 100 nm thick deposited in this order from the substrate side. For example, the Ti film is deposited by using Ti as a target and Ar as sputtering gas under the conditions of a substrate temperature of 200° C., a pressure of 4 mTorr, a sputtering gas flow rate of 20 sccm, and a film formation speed of about 100 nm/min, and the TiN film is deposited through reactive sputtering by using Ti as a target and mixed gas of $N_2$ and Ar as sputtering gas under the conditions of a substrate temperature of 200° C., a pressure of 6 mTorr, a sputtering gas flow rate of 20 sccm, and a film formation speed of about 75 nm/min.

The adhesion layer 6 may be a single layer of TiN, TiW or WSi, a laminated layer thereof, or a laminated layer of a lower Ti layer and an upper TiW or WSi layer.

A W layer 7 is deposited through CVD on the surface of the adhesion layer 6, the W layer being sufficiently thick for completely filling the insides of the connection holes 5S and 5D. For example, the W layer 7 is deposited by using a source gas of $WF_6$ at a flow rate of 80 sccm and $H_2$ as a reduction gas under the conditions of a growth temperature of 450° C., a pressure of 8 Torr, and a film formation speed of about 0.3 to 0.5 $\mu$m/min. The insides of the connection holes 5S and 5D are completely filled with the W layer 7, and the surface of the interlayer insulating film 4 is covered with the W layer 7.

Figure 1C:
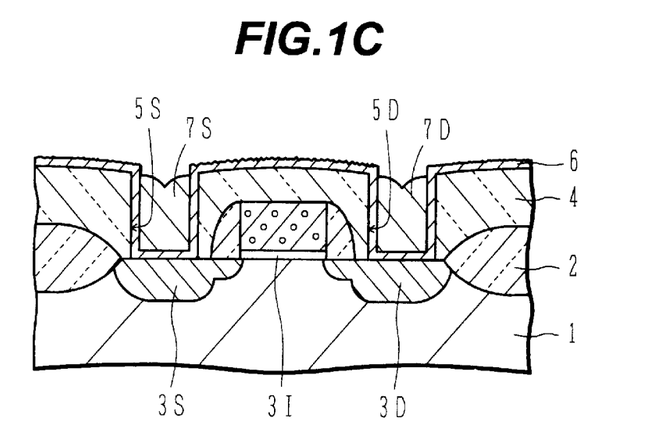

As shown in FIG. 1C, the W layer 7 is etched back to remove the W layer deposited on the region other than the connection holes 5S and 5D. The W layer 7 is dry etched by using $SF_6$ or $CBrF_3$ as an etching gas at an etching selection ratio of 1:(10 to 30) for the adhesion layer 6:the W layer 7. W plugs 7S and 7D are therefore left in the connection holes 5S and 5D. In order to fully remove the unnecessary W layer 7 on the region other than the connection holes 5S and 5D, it is preferable to slightly over-etch the W layer 7. With this over-etch, the upper surfaces of the W plugs 7S and 7D become slightly lower then the upper surface of the adhesion layer 6, forming shallow recesses over the W plugs 7S and 7D in the connection holes. The texture of the surface of the adhesion layer 6 (the surface of the TiN film if the two-layer structure of TiN/Ti is employed) is made rough by this over-etch.

Figure 1D:
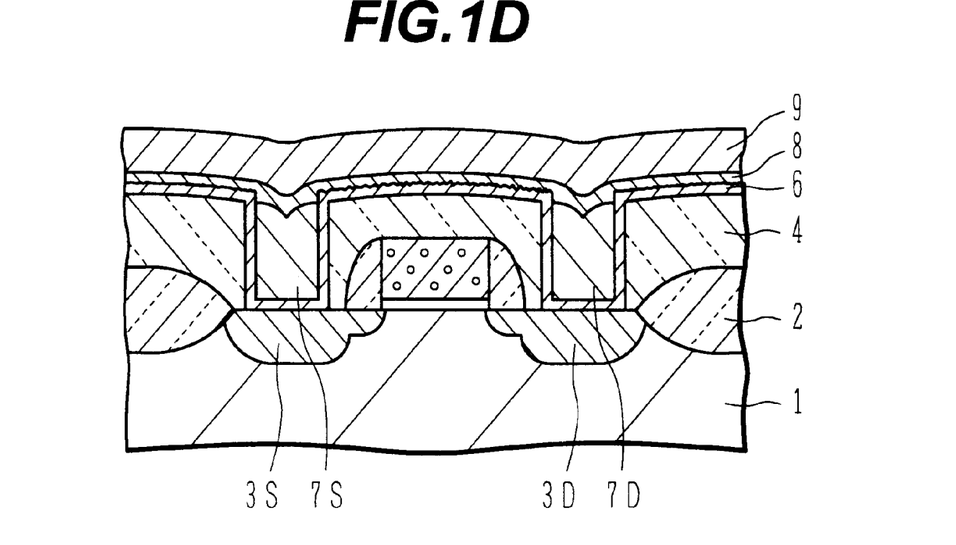

Referring to FIG. 1D, an underlying layer 8 of about 15 nm thick made of Ti is deposited over the whole surface of the substrate including the upper surfaces of the W plugs 7S and 7D. The underlying layer 8 is deposited, for example, in the same manner as in the case of forming the Ti film of the adhesion layer 6 described with FIG. 1B. The W plugs are sandwiched or surrounded by the adhesion layer 6 and underlying layer 8. After the process of forming the underlying layer 8 and until the next process of forming an Al or Al alloy layer, the substrate is not exposed in the external ambient atmosphere. The oxygen partial pressure on the substrate surface is maintained typically at $1\times10^{-8}$ Torr or lower. The Ti layer is not oxidized therefore.

Even if the texture of the adhesion layer such as TiN is made rough, the surface of the Ti layer 8 is not oxidized so that the wiring layer of Al or Al alloy formed on the surface of the Ti layer 8 is prevented from deterioration of orientation. The above consecutive processes may be performed by using a multi-chamber sputtering system.

A wiring layer 9 is deposited on the underlying layer 8 by sputtering, the wiring layer 9 being made of Al alloy containing 1 wt. % of Si and 0.5 wt. % of Cu. For example, the wiring layer 9 is deposited by using Al alloy as a target and Ar as sputtering gas under the conditions of a substrate temperature of 150° C., a pressure of 2 mTorr, a sputter gas flow rate of 20 sccm, and a film formation speed of about 1 $\mu$m/min.

Since the Ti film 8 is not exposed in the ambient atmosphere, the surface thereof is not oxidized and the texture of the surface thereof is not made rough. As compared to the case wherein an Al (alloy) film is formed on a Ti film exposed in an external ambient atmosphere and oxidized, the orientation of an Al (alloy) film formed on a non-oxidized Ti film improves considerably.

After the wiring layer 9 is formed, the substrate is subjected to heat treatment for about 120 seconds at a temperature of 450 to 500° C. without exposing the substrate in the external ambient atmosphere. This heat treatment reflows Al alloy and the step coverage at the shallow recesses formed in the openings of the connection holes 5S and 5D is improved.

Figure 1E:
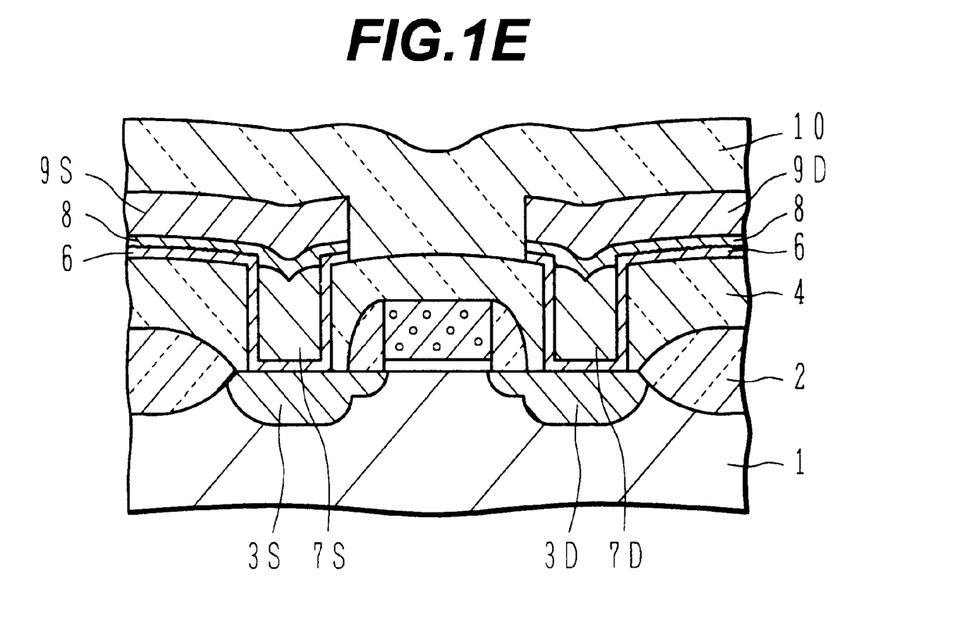

As shown in FIG. 1E, the wiring layer 9 together with the underlying layer 8 and adhesion layer 6 is patterned to form an interconnection 9S connected via the W plug 7S to the source region 3S and an interconnection 9D connected via the W plug 7D to the drain region 3D. An interlayer insulating film 10 made of insulating material such as PSG is deposited by CVD or the like, covering the interconnections 9S and 9D.

Figure 2:
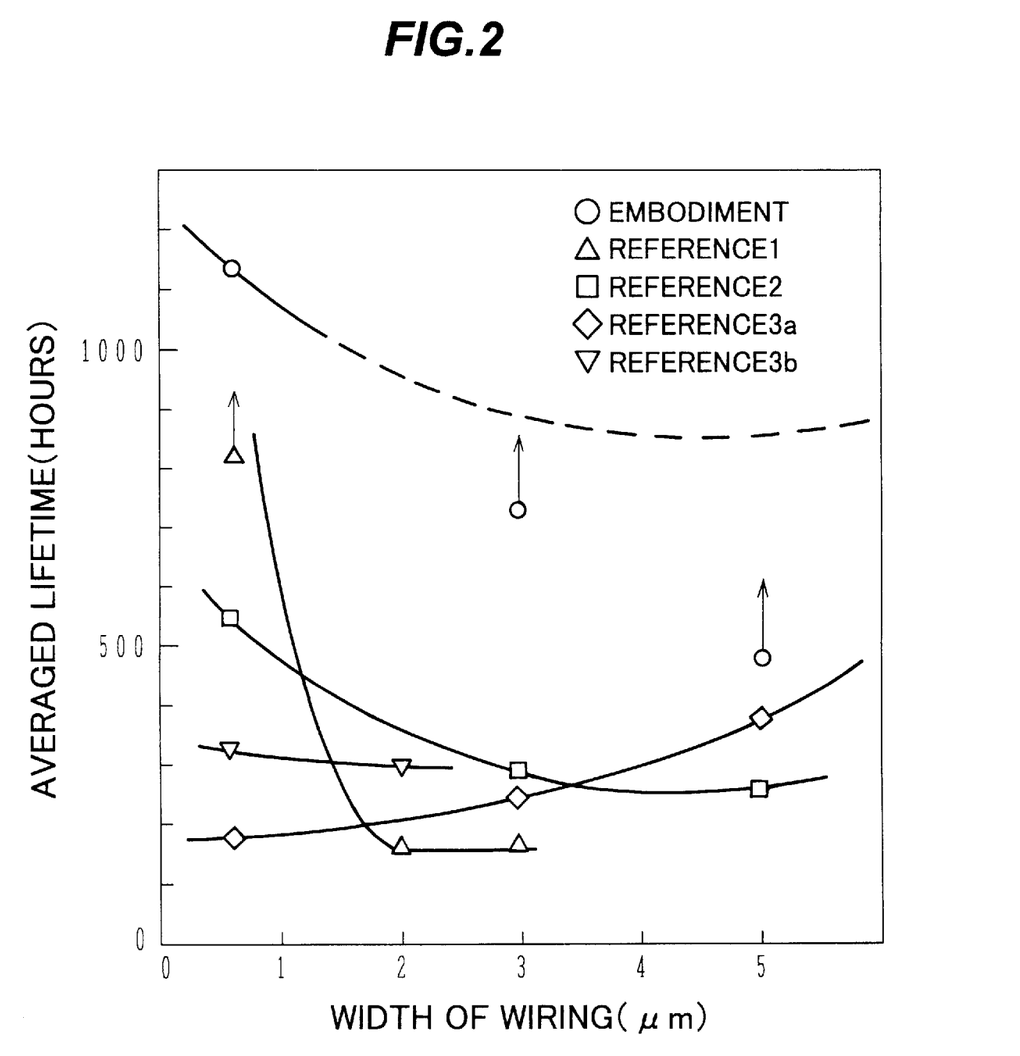
FIG. 2 is a graph showing average lifetimes of wirings formed by the embodiment method of forming a wiring layer, compared to average lifetimes of wirings formed by reference methods of forming a wiring layer.

FIG. 2 is a graph showing evaluation results of resistance to electromigration of wirings formed by the embodiment method and conventional methods. The abscissa represents a width of wiring in the unit of μm, and the ordinate represents an average lifetime of wiring in the unit of hour. The number of samples used for each of the embodiment and conventional methods was 10 to 20. The accumulation time when half of the samples became defective was defined as the average lifetime. When the resistance increased by 1.0% or more from the initial resistance, it was judged as defective. The thickness of each wiring was 0.52 μm, the current density at evaluation was set to $1.5 \times 10^6$ A/cm$^2$ and a temperature was set to 190° C.

A symbol ○ in the graph shows an average lifetime of wirings formed by the embodiment method, and symbols △, □, ◇, ▽ indicate average lifetimes of wirings formed by reference methods 1, 2, 3a, and 3b shown in Table 1. Symbols △ and ○ with arrows indicate that there were no defective samples before the evaluation times as indicated at the ordinate. Therefore, these samples showed the average lifetimes longer than those indicated at the ordinate in this graph.

TABLE 1

Wiring layer forming methods

| | | | |
|---|---|---|---|
| Embodiment | ○ | Reflow/AlSiCu(400)/Ti(15) | //W plug//TiN(100)/Ti(20) |
| Reference 1 | △ | AlSiCu(400) | //W plug//TiN(100)/Ti(20) |
| Reference 2 | □ | Reflow/AlSiCu(400) | //W plug//TiN(100)/Ti(20) |
| Reference 3a | ◇ | AlSiCu(400)/TiN(50) | //W plug//TiN(100)/Ti(20) |
| Reference 3b | ▽ | AlSiCu(400)/Ti(15) | //W plug//TiN(100)/Ti(20) |

Each section partitioned by symbol "/" or "//" shows the material of a deposited film or the process contents. A film formation or other process in each section is performed in the order from right to left. The symbol "/" shows a film formation or other process to be executed without exposing the sample to an external ambient atmosphere, and the symbol "//" shows a film formation or other process to be executed after exposing the sample once to an external ambient atmosphere. The numeral in parentheses at the right of each film material indicates a thickness of each film in the unit of nm.

As shown in FIG. 2, the average lifetimes of wirings formed by the embodiment method are longer than those formed by reference methods in the range of width of wiring from 0.5 to 5 μm. Good resistance to electromigration is therefore obtained. Similar results are expected even for the ranges outside the measured range.

A difference between the embodiment method and reference method 2 depends on whether there is a Ti underlying layer under the Al alloy wiring layer. As appreciated from the comparison between the embodiment method and the reference method 2, the Ti underlying layer under the wiring layer improves resistance to electromigration. A difference between the reference methods 3a and 3b is a difference of only the material of the underlying layer. As seen from these reference methods 3a and 3b, the underlying layer of Ti is more preferable than the underlying layer of TiN.

A difference between the embodiment method and the reference method 3b is a presence/absence of a reflow process after the Al alloy wiring layer is formed. As seen from the embodiment method and the reference method 3b, the reflow process improves resistance to electromigration.

Improvement on resistance to electromigration by the Ti underlying layer under the wiring layer may be ascribed to better (1 1 1) orientation of Al alloy of the wiring layer. Improvement on resistance to electromigration by the reflow process may be ascribed to stress relaxation in the wiring layer by heat treatment.

As seen from the comparison between the reference methods 1 and 2, the reflow process for the width of wiring of 0.5 μm shortens the average lifetime. This may be ascribed to influences of orientation worsened by the heat treatment rather than influences of stress relaxation by heating at the reflow process.

Next, the evaluation results of orientation of Al alloy deposited on a Ti underlying layer will be described. Evaluations were conducted by X-ray diffraction (θ–2θ method) of wirings formed by the embodiment method and reference methods 1 to 3b. Peak intensities of (1 1 1) orientation of Al wirings formed by the embodiment method and reference methods 1, 2, 3a, and 3b were 148 keps, 30 keps, 52 kcps, 89 keps, and 148 kcps, respectively. As seen from these evaluation results, it can be known that a Ti underlying layer is effective for improving the (1 1 1) orientation of Al alloy deposited on the Ti underlying layer.

Although the peak intensities of the embodiment method and the reference method 3b are the same, resistances to electromigration are very different as seen From FIG. 2. This difference may be ascribed to a presence/absence of stress relaxation of the wiring layer to be caused by the reflow process to be described next.

The stress relaxation of a wiring layer by the reflow process will be described with reference to FIGS. 3 and 4.

Figure 3:
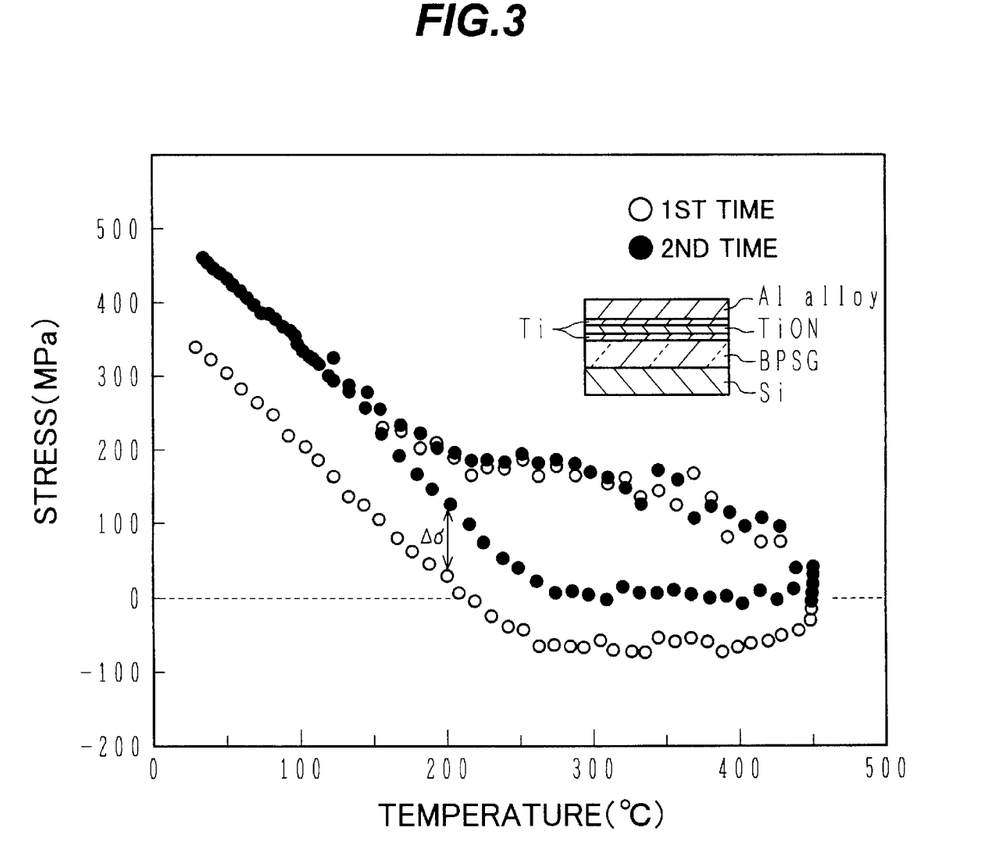
FIG. 3 is a graph showing a relationship between a substrate temperature and a stress in an Al alloy wiring layer underwent thermal hysteresis.

FIG. 3 shows changes in stress in an Al alloy wiring layer formed without a reflow process but subjected to heat hysteresis. The abscissa represents a substrate temperature in the unit of ° C., and the ordinate represents a stress (positive for tensile stress) in the wiring layer in the unit of MPa. Evaluation samples were prepared by forming a BPSG film of 450 nm thick on a silicon substrate and by forming on the BPSG film a Ti film of 20 nm thick, a TiON film of 100 nm thick, a Ti film of 15 nm thick, and an Al alloy film of 400 nm thick in this order.

The internal stress a in an Al alloy film can be approximated by the following equation (1).

$$\sigma = 1/6 \times E/(1-\nu) \times h^2/t \times (1/R - 1/R_0) \quad (1)$$

where $E/(1-\nu)$ represents a biaxial elastic coefficient $(1.805 \times 10^{11}$ Pa) of the silicon substrate, h represents a thickness of the silicon substrate, t represents a thickness of the Al alloy film, $R_0$ represents a radius of curvature of the substrate before the Al alloy film is formed, and R represents a radius of curvature of the substrate after the Al alloy film is formed.

The radius of curvature of the substrate was measured while the substrate temperature is raised and lowered, and the stress in the Al alloy film was calculated from the equation (1). Symbols ○ and ● indicate the stress in the Al alloy film at first and second times during the temperature rise and fall process. There is an initial stress of about 350 MPa in the wiring layer at the room temperature. During the temperature rise and fall process of the first time, the temperature was raised to 450° C. at a speed of 5° C./min and the state at the temperature of 450° C. was maintained for 10 minutes. Thereafter, the temperature was lowered to 100° C. at a speed of 5° C./min. During the temperature rise and fall process of the second time, the temperature was raised from 100° C. to 450° C. at a speed of 5° C./min and the state at the temperature of 450° C. was maintained for 10 minutes. Thereafter, the temperature was lowered to the room temperature at a speed of 50° C./min.

During the temperature rise process at the first time, as the temperature rose, the stress lowered and became almost 0 at the temperature of 200° C. As the temperature rose above 200° C., the stress became negative (compressive stress) and maintained generally a constant value (about −80 MPa) up to the temperature of 450° C. As the temperature was maintained at 450° C., the stress gradually rose toward 0. As the temperature was lowered, the stress gradually became large via a hysteresis loop different from the temperature rise process.

At the second temperature rise process, as the temperature rose, the stress lowered via a hysteresis loop different from the first temperature rise process. In the temperature range of 270° C. or higher, the stress became approximately 0. As the temperature was lowered, the stress gradually increased via generally the same hysteresis loop as the first temperature rise process. The stress when the temperature lowered to the room temperature was about 470 MPa.

Figure 4:
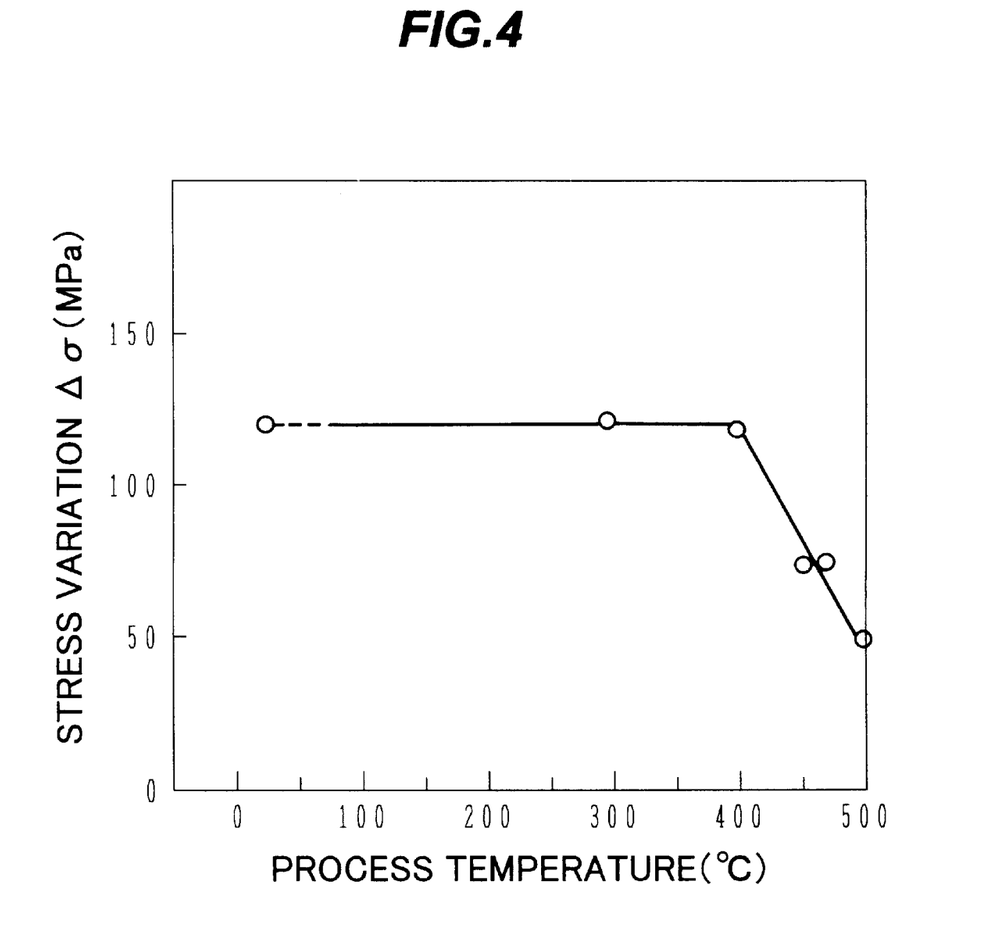
FIG. 4 is a graph showing a stress change in an Al alloy wiring layer underwent thermal hysteresis, as a function of a temperature of the reflow process performed after the Al alloy wiring layer is formed.

FIG. 4 is a graph showing a stress variation Δσ in an Al alloy wiring layer subjected to a reflow process for about 120 seconds and underwent the heat hysteresis shown in FIG. 3, the stress variation being represented as a function of a reflow process temperature. The abscissa represents a reflow process temperature in the unit of ° C., and the ordinate represents a stress variation in the unit of MPa. The stress variation Δσ was defined as a difference of stresses at 200° C. during the temperature rise and fall processes of the first and second times. A symbol ○ at the left end in FIG. 4 is obtained without the reflow process.

In the reflow process temperature of 400° C. or lower, the stress variation Δσ was generally constant at about 120 MPa and there was no significant difference between with and without the reflow process. At the reflow process temperatures of 450° C. and 500° C., the stress variation lowered to about 70 MPa and 50 MPa. Namely, at the reflow process at 450° C., the stress variation in the wiring layer to be caused by the later heat hysteresis was reduced. This may be ascribed to a thermal stability of the wiring layer caused by the reflow process at a temperature of 450° C. or higher.

In general manufacture processes for semiconductor integrated circuits, a heat treatment is performed after a wiring layer is formed in order to thereafter form an interlayer insulating film or a passivation film. After the wiring layer is formed, a reflow process is performed to undergo at least one thermal hysteresis before transition to the next process. By thermally stabilizing the wiring layer, it can be expected that adverse effects by a thermal hysteresis at the next or following process can be alleviated. It can be therefore expected that wiring layers having higher resistance to electromigration can be formed.

As seen from FIG. 4, it can be noted that the reflow process temperature is preferably set to 450° C. or higher. As the reflow process temperature is raised, the surface smoothness of an Al alloy wiring layer becomes worse. In order to perform the reflow process while maintaining the surface smoothness, it is preferable to set the reflow process temperature to 500° C. or lower. The reflow process time was set to 120 seconds in the example shown in FIG. 4. It is sufficient that this reflow process time is set so as to be sufficient for increasing the thermal stability of the Al alloy film. In order to maintain the effects of improved thermal stability by the reflow process, it is preferable to perform the reflow process for 100 seconds or longer.

In the above embodiment, after the Al alloy wiring layer 9 is formed at the process shown in FIG. 1D, the reflow process is performed in succession without exposing the substrate to the external ambient atmosphere. The effects of the successive reflow process without exposing the substrate to the external ambient atmosphere will be studied.

Figure 5A:
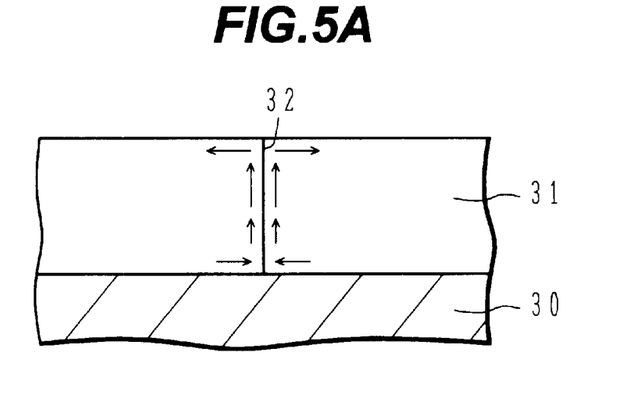
FIGS. 5A, 5B and 5C are cross sectional views of a substrate illustrating motion of atoms in an Al alloy layer during a temperature rising and lowering process.

FIG. 5A is a schematic diagram illustrating motion of atoms in an Al alloy wiring layer during the temperature rise process. An Al alloy layer 31 is formed on a silicon substrate 30. Grain boundaries 32 are present in the Al alloy layer 31 from the bottom to the top thereof. Since the thermal expansion coefficient of Al alloy is higher than that of silicon, as the substrate is heated, it warps in the direction of pushing the Al alloy layer 31 outside. At this time, because of elasticity of the silicon substrate 30, compressive stress is generated in the Al alloy film 31.

As indicated by the symbol ○ in FIG. 3, if the tensile stress remains in the Al alloy film 31, the tensile stress lowers as the temperature rises. As the temperature rises in excess of a certain value, the compressive stress is generated.

Although the compressive stress become large as the temperature rises, at a certain temperature or higher, Al atoms move along the boundaries and reach the surface of the Al alloy film 31. Al atoms reached the surface then move along the surface area of the Al alloy film 31. Al atoms moved from the Al alloy film to the surface thereof make the internal stress relax.

In the temperature range from 250° C. or higher during the temperature rise process shown in FIG. 3, the amount of lowered stress (amount of increased compressive stress) becomes saturated and takes generally a constant value. This phenomenon supposedly results from relaxation of internal stress by motion of Al atoms.

Figure 5B:
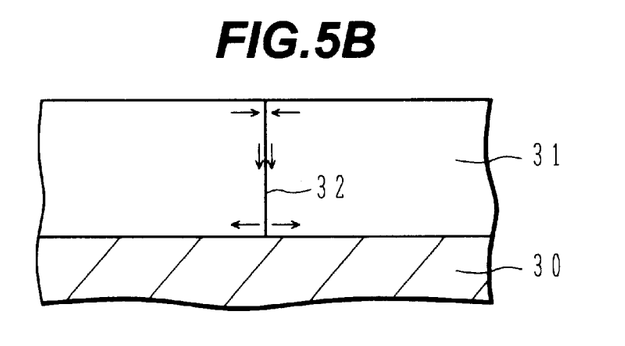

FIG. 5B is a schematic diagram illustrating motion of atoms in an Al alloy wiring layer during the temperature fall process. As the temperature lowers, the tensile stress in the Al alloy film 31 increases. Since the tensile stress is relaxed, atoms on the surface of the Al alloy film 31 move toward the inside along the grain boundaries.

Atoms become hard to move as the substrate temperature lowers, and the amount of moving atoms during the temperature fall process is smaller than during the temperature rise process. Therefore, the degree of relaxing the compressive stress during the temperature rise process becomes smaller than the degree of relaxing the tensile stress during the temperature fall process, and the tensile stress (● at the left of FIG. 3) at the initial temperature becomes larger than the initial tensile stress indicated by ○ at the left of FIG. 3.

Figure 5C:
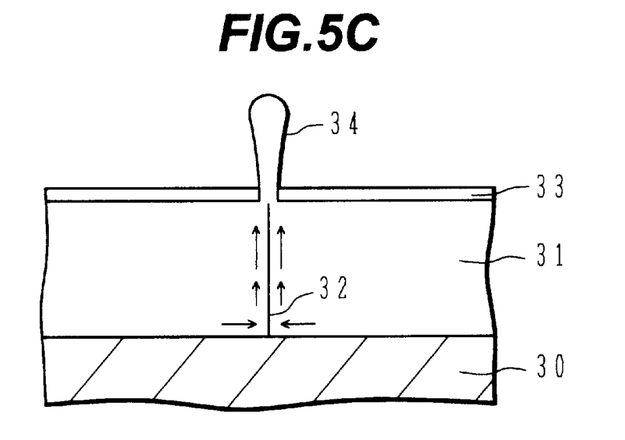

FIG. 5C is a schematic diagram illustrating motion of atoms in an Al alloy wiring layer 31 with an oxide film 33 formed on the surface of the wiring layer, during the temperature rise process. Similar to the case shown in FIG. 5A, Al atoms in the Al alloy film 31 move along the boundaries 32 and reach the surface of the Al alloy film 31. In this case, since the surface of the Al alloy film 31 is covered with the oxide film 33, Al atoms are more difficult to move along the surface area as compared with the case shown in FIG. 5A. Therefore, Al atoms concentrate in the surface region of the Al alloy film 31 where the boundaries 32 are present, and a hillock 34 may be generated in some cases.

Al atoms in the hillock 34 do not return to the inside of the Al alloy film 31 even if the temperature is lowered, so that the hillock 34 does not disappear.

After the Al alloy wiring layer 9 is deposited at the process shown in FIG. 1D, the reflow process is performed without exposing the substrate to the external ambient atmosphere. Therefore, an oxide film is prevented from being formed, the formation of a hillock is suppressed, and in addition, the thermal stability of the wiring layer 9 can be improved.

In the embodiment shown in FIGS. 1A to 1E, the impurity diffused region formed in the surface area of the silicon substrate 1 is connected to the upper wiring layer. This embodiment is also applicable to interconnections between wiring layers of a multi-layer structure, by replacing the diffused region with a lower wiring pattern.

In the above embodiment, although the Ti underlying layer is deposited to 15 nm thick at the process shown in FIG. 1D, it may be deposited to a different thickness. In order to improve orientation of Al alloy, the thickness of the underlying layer 8 is preferably set to 5 nm or thicker. If the underlying layer 8 is made thick while keeping the total thickness of the wiring layer at a constant value, the Al alloy layer 9 should become thin and the resistance of the total wiring layer increases. Therefore, the thickness of the underlying layer 8 is preferably set to 30 nm or thinner.

The present invention has been described in connection with the preferred embodiments. The invention is not limited only to the above embodiments. It is apparent that various modifications, improvements, combinations, and the like can be made by those skilled in the art.

We claim:

1. A method of forming a wiring comprising the steps of:
   a) depositing an interlayer insulating film made of insulating material on a substrate having a conductive region at least partially on a surface area of the substrate;
   b) forming a connection hole through the interlayer insulating film, the connection hole partially exposing the conductive region;
   c) filling the connection hole with a plug made of conductive material, the plug filling substantially the entire connection hole but not extending to a top surface of the interlayer insulating film;
   d) depositing an underlying layer made of Ti over whole surface of the substrate including a surface of the plug;
   e) depositing a wiring layer made of Al alloy on the underlying layer; and
   f) reflowing the wiring layer by heating the substrate.

2. A method according to claim 1, wherein said step c) includes the step of depositing a conductive material layer and the step of etching back the conductive material layer.

3. A method according to claim 2, wherein said step c) further includes the step of forming an adhesion layer on the surface of the interlayer insulating film and on an inner surface of the connection hole, and said step of etching back the conductive material layer leaves the adhesion layer on the surface of the interlayer insulating film.

4. A method according to claim 1, wherein said step e) deposits the wiring layer after the underlying layer is deposited, without exposing a surface of the underlying layer to an oxidizing atmosphere.

5. A method according to claim 3, wherein said step e) deposits the wiring layer after the underlying layer is deposited, without exposing a surface of the underlying layer to an oxidizing atmosphere.

6. A method according to claim 4, wherein said step e) deposits the wiring layer after said step d) while the oxygen partial pressure on the surface of the underlying layer is maintained to $1\times10^{-8}$ Torr or lower.

7. A method according to claim 5, wherein said step e) deposits the wiring layer after said step d) while the oxygen partial pressure at the surface of the underlying layer is maintained to $1\times10^{-8}$ Torr or lower.

8. A method according to claim 1, wherein said step f) reflows the wiring layer by heating the substrate to 450° C. or higher.

9. A method according to claim 5, wherein said step f) reflows the wiring layer by heating the substrate to 450° C. or higher.

10. A method according to claim 8, wherein said step f) reflows the wiring layer by heating the substrate to 500° C. or lower.

11. A method according to claim 9, wherein said step f) reflows the wiring layer by heating the substrate to 500° C. or lower.

12. A method according to claim 11, wherein said heating the substrate is done for 100 seconds or more.

13. A method according to claim 1, wherein said step d) deposits the underlying layer to a thickness of 5 to 30 nm.

14. A method according to claim 13, wherein said heating the substrate is done for 100 seconds or more.

15. A method according to claim 11, wherein said step d) deposits the underlying layer to a thickness of 5 to 30 nm.

16. A method according to claim 1, wherein said step f) reflows the wiring layer by heating the substrate after said step e) without exposing a surface of the wiring layer to an oxidizing atmosphere.

17. A method according to claim 15, wherein said step f) reflows the wiring layer by heating the substrate after said step e) without exposing a surface of the wiring layer to an oxidizing atmosphere.

18. A method according to claim 1, wherein said step c) includes the steps of:
   depositing a plug material layer of tungsten over a whole surface of the substrate, the plug material layer being filled in the connection hole; and
   etching back the plug material layer to remove the plug material deposited in the area other than the connection hole and leave the plug material layer only in the connection hole.

19. A method according to claim 1, further comprising the step of depositing an adhesion layer on a surface of the interlayer insulating film and on an inner surface of the connection hole after said step b) and before said step c), the adhesion layer being made of a material selected from the group consisting of TiN, TiW, and WSi.

20. A method according to claim 18, further comprising the step of depositing an adhesion layer on a surface of the interlayer insulating film and on an inner surface of the connection hole after said step b) and before said step c), the adhesion layer being made of a material selected from the group consisting of TiN, TiW, and WSi.

21. A method according to claim 19, wherein a level of a surface of the plug formed at said step c) is lower than a level of the adhesion layer formed on the interlayer insulating film.

22. A method according to claim 20, wherein a level of a surface of the plug formed at said step c) is lower than a level of the adhesion layer formed on the interlayer insulating film.

23. A method according to claim 19, wherein said step e) forms an Al Alloy layer having strong (1 1 1) orientation.

24. A method of forming a wiring comprising the steps of:
   a) depositing an interlayer insulating film made of insulating material on a substrate having a conductive region at least partially on a surface area of the substrate;

b) forming a connection hole through the interlayer insulating film, the connection hole partially exposing the conductive region;

c-1) forming an adhesion layer on a surface of the interlayer insulating film and on an inner surface of the connection hole;

c-2) depositing a conductive material layer;

c-3) etching back the conductive material layer to leave a conductive plug in the connection hole and to remove the conductive material layer on the interlayer insulating film to expose the adhesion layer, the plug filling substantially the entire connection hole but not extending to a top surface of the interlayer insulating film;

d) depositing an underlying layer made of Ti over a whole surface of the substrate including a surface of the plug;

e) after said step d), depositing a wiring layer made of Al alloy on the underlying layer without exposing the underlying layer to an external oxidizing atmosphere; and f) reflowing the wiring layer by heating the substrate to a temperature of 450° C. to 500° C.

25. A method according to claim 24, wherein a surface of the adhesion layer exposed at said step c-3) is rough.

26. A method according to claim 25, wherein said step d) deposits the underlying layer to a thickness of 5 to 30 nm.

* * * * *